United States Patent

Sichert

Patent Number: 6,020,766
Date of Patent: Feb. 1, 2000

[54] INPUT AMPLIFIER WITH UNILATERAL CURRENT SHUTOFF FOR INPUT SIGNALS WITH STEEP EDGES

[75] Inventor: Christian Sichert, München, Germany

[73] Assignee: Siemens Aktiengesellschaft, Munich, Germany

[21] Appl. No.: 09/054,927

[22] Filed: Apr. 3, 1998

[30] Foreign Application Priority Data

Apr. 3, 1997 [DE] Germany ............... 197 13 833

[51] Int. Cl.⁷ ...................................... H03F 3/45
[52] U.S. Cl. ............................... 327/53; 327/77
[58] Field of Search ........................ 327/52, 53, 56, 327/78, 77, 89, 563, 374, 375, 376, 377, 65, 66; 323/315

[56] References Cited

U.S. PATENT DOCUMENTS

| | | | |
|---|---|---|---|
| 4,644,196 | 2/1987 | Flannagan | 327/53 |
| 4,697,112 | 9/1987 | Ohtani et al. | 327/53 |
| 4,808,859 | 2/1989 | Even-or et al. | 327/432 |
| 4,845,672 | 7/1989 | Watanabe et al. | 365/190 |
| 5,391,940 | 2/1995 | Linn | 326/21 |
| 5,473,567 | 12/1995 | McClure | 365/208 |
| 5,493,244 | 2/1996 | Pathak et al. | 327/313 |
| 5,495,195 | 2/1996 | Fontana et al. | 327/108 |
| 5,508,643 | 4/1996 | Khieu | 327/51 |
| 5,789,948 | 8/1998 | Kim et al. | 327/55 |

FOREIGN PATENT DOCUMENTS

| | | |
|---|---|---|
| 4301921 | 10/1992 | Japan . |
| 6104725 | 4/1994 | Japan . |

*Primary Examiner*—Toan Tran
*Assistant Examiner*—Anh-Quan Tra
*Attorney, Agent, or Firm*—Herbert L. Lerner; Laurence A. Greenberg

[57] ABSTRACT

The input amplifier with unilateral current shutoff for input signals with steep edges has a MOS transistor, the source or drain of which is connected to a node connected to an output stage. An N-channel MOS transistor, which is connected between the two P-channel MOS transistors of the input amplifier, prevents a shutoff of the P-channel MOS transistor by the steep edge input signals. The node is pulled upward to the operating voltage when the input signal is present.

4 Claims, 3 Drawing Sheets

INPUT AMPLIFIER WITH UNILATERAL CURRENT SHUTOFF FOR INPUT SIGNALS WITH STEEP EDGES

BACKGROUND OF THE INVENTION

Field of the Invention

The invention relates to an input amplifier with unilateral current shutoff for input signals with steep edges (in particular "high-low" edges). The input amplifier has at least one transistor with an electrode connected to an output.

CMOS input amplifiers have been known for a relatively long time and are used for the most manifold purposes in circuitry. For instance, an input amplifier of the above type is described for instance in the textbook "CMOS Analog Circuit Design" by P. E. Allen and D. R. Holberg, p. 381.

One such prior art input amplifier will be described below with reference to FIG. 3. The prior art input amplifier has a differential amplifier, one P-channel MOS transistor, and one N-channel MOS transistor. The gates of the MOS transistors and an input of the differential amplifier are connected to an input terminal which receives an input signal, and the source-to-drain path of one of the MOS transistors connects to an an operating voltage. The differential amplifier also is subject to a reference voltage.

Possible uses of those prior art input amplifiers are for instance LVTTL circuits (LVTTL stands for low voltage transistor-to-transistor logic) and SSTL logic circuits (SSTL stands for stub series terminated logic). In LVTTL logic circuits, leading and trailing voltage edges of approximately 0.8 V to 2.0 V occur, while the SSTL logic circuits have corresponding leading and trailing edges of approximately 400 mV about a reference value.

In both logic circuits, that is, the LVTTL logic circuits and the SSTL logic circuits, the trailing voltage edges are very steep, so that the input edges are correspondingly fast. If numerous input amplifiers are provided on a chip, then in a current-saving operating mode only those circuits that are triggered should actually be active.

However, it has been found that with steep edges of the input signals, a corresponding shutoff of the input amplifier is not reliably assured.

This problem has been previously attacked by employing current mirror circuits or asymmetrical input amplifiers. However, current mirror circuits consume a relatively large amount of current, while asymmetrical input amplifiers are disadvantageous in terms of the symmetry of their switching performance.

SUMMARY OF THE INVENTION

It is accordingly an object of the invention to provide an input amplifier with unilateral current shutoff for input signals with steep edges, which overcomes the above-mentioned disadvantages of the prior art devices and methods of this general type and which can assure reliable switching even with fast input edges.

With the foregoing and other objects in view there is provided, in accordance with the invention, an input amplifier with unilateral current shutoff for input signals with steep edges, comprising:

an input receiving an input signal and an output outputting an output signal;

at least one transistor having an electrode connected to the output; and a device for preventing a complete shutoff of the transistor by raising a voltage at the electrode toward an operating voltage of the input amplifier when the input signal with a steep edge is present at the input.

In other words, the objects of the invention are satisfied in the novel circuit which incorporates a device which prevents a complete shutoff of the transistor so that the electrode can be pulled upward to the operating voltage as soon as the input signal with the steep edge is present.

In accordance with an additional feature of the invention, the at least one transistor is a first MOS transistor of a first conductivity type, and the device includes a further MOS transistor of a second conductivity type, the second MOS transistor having a higher cutoff voltage than the first MOS transistor.

In accordance with again another feature of the invention, the differential amplifier includes the first MOS transistor and a second MOS transistor, and wherein the further MOS transistor has a source-to-drain path connected between the gates of the first and second MOS transistors of the differential amplifier. The gate of the further MOS transistor is thereby connected to the source or the drain of the first and second transistors or to the operating voltage.

Other features which are considered as characteristic for the invention are set forth in the appended claims.

Although the invention is illustrated and described herein as embodied in an input amplifier with unilateral current shutoff for input signals with steep edges, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
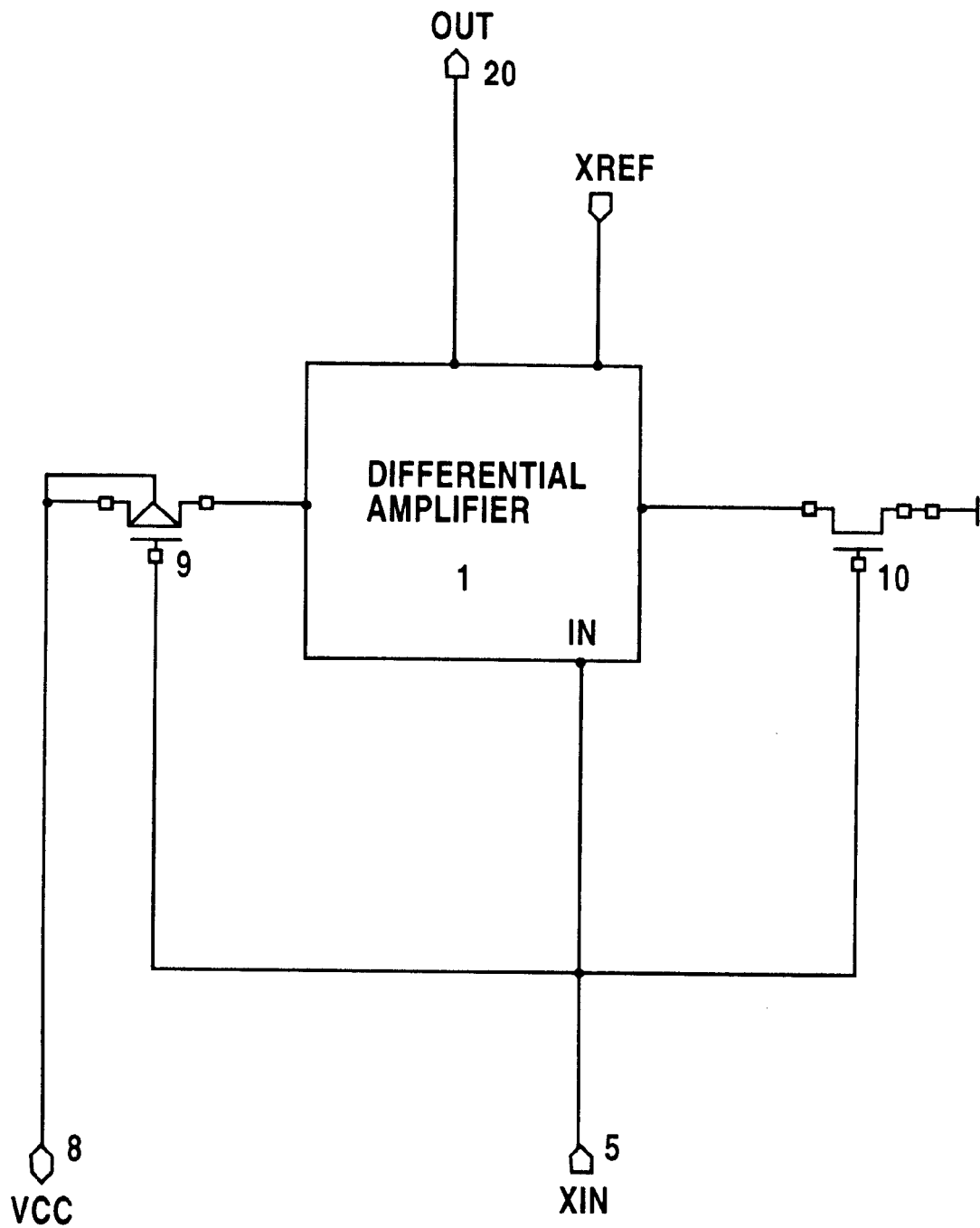
FIG. 3 is a circuit diagram of a prior art input amplifier.

Referring now to the figures of the drawing in detail in which equivalent components are provided with the same reference numerals throughout, and first, particularly, to FIG. 3 thereof, there is seen a prior art input amplifier which comprises a differential amplifier 1, one P-channel MOS transistor 9 and one N-channel MOS transistor 10. Gates of the transistors 9, 10 and an input IN of the differential amplifier 1 are connected to an input terminal 5, at which an input signal XIN is present. The source-to-drain path of the transistor 9 is connected to a terminal 8 for an operating voltage VCC. The differential amplifier 1 is also acted upon by a reference voltage XREF and it is connected to an output terminal 20 for outputting an output signal OUT.

Figure 1:
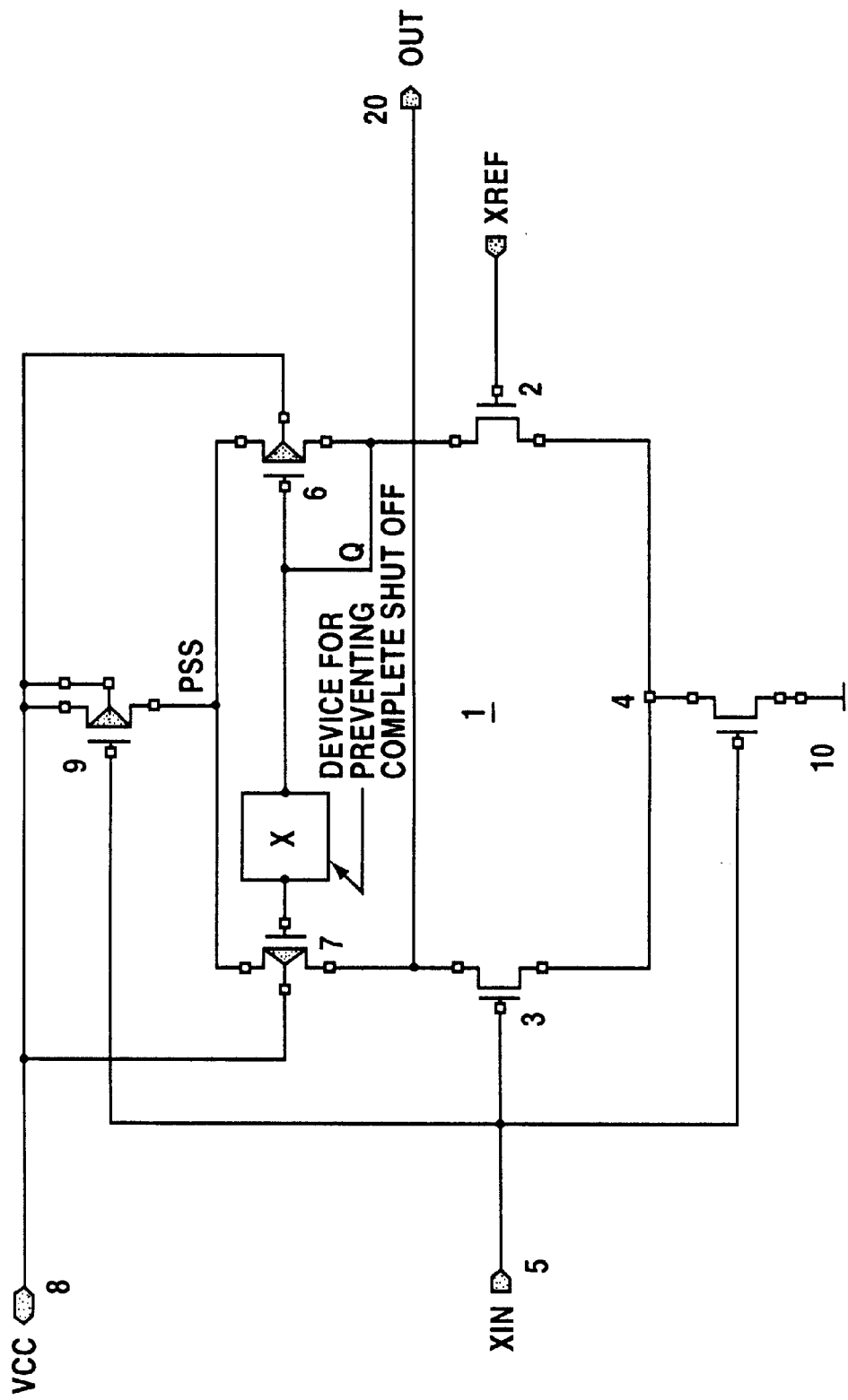
FIG. 1 is a circuit diagram of an input amplifier according to the invention.

Referring now to FIG. 1, a differential amplifier 1 comprises an N-channel MOS transistor 2 with a gate driven by a reference voltage XREF, and an N-channel MOS transistor 3 that is symmetrical to the transistor 2 with regard to a node 4. An input signal XIN is delivered to an input terminal 5, which is connected to the gate of the transistor 3. The sources or drains of transistors 2, 3 are connected to current mirror P-channel MOS transistors 6, 7, whose substrates are each acted upon by an operating voltage VCC, which is delivered via a terminal 8. The operating voltage VCC is also applied to a P-channel MOS transistor 9, whose gate is supplied with the input signal XIN. The source or drain of the N-channel MOS transistor 10 is connected to the node 4, and the input signal XIN from the input terminal is applied to its gate. The gate of the transistor 6 is connected to a node Q between the transistors 2 and 6 and to the gate of the transistor 7. A node QN between the transistors 3 and 7 is also connected to an output terminal 20 for furnishing an output signal OUT.

The transistors 9, 10 serve to turn off a quadrature-axis component of current that flows in the differential amplifier 1 when the voltage rises are high.

The transistors 3, 7 are symmetrical to the transistors 2, 6. The current mirror comprising the transistors 6 and 7 may also be embodied with N-channel MOS transistors; analogously, the input transistors 2, 3 may be P-channel MOS transistors.

By way of example, the input terminal 5 may carry an input signal which in LVTTL logic drops off steeply from somewhat above 2.0 V to below 0.8 V.

A "high-low voltage edge" of this kind, in a circuit as described above, turns off the transistor 10, and as a result the node Q is pulled upward in its voltage by the transistor 6. This in turn switches off the transistor 7 as well, although intrinsically it should pull the voltage of the node QN upward. In other words, the input amplifier described thus far does not function satisfactorily with input signals that have steep edges.

Figure 2:
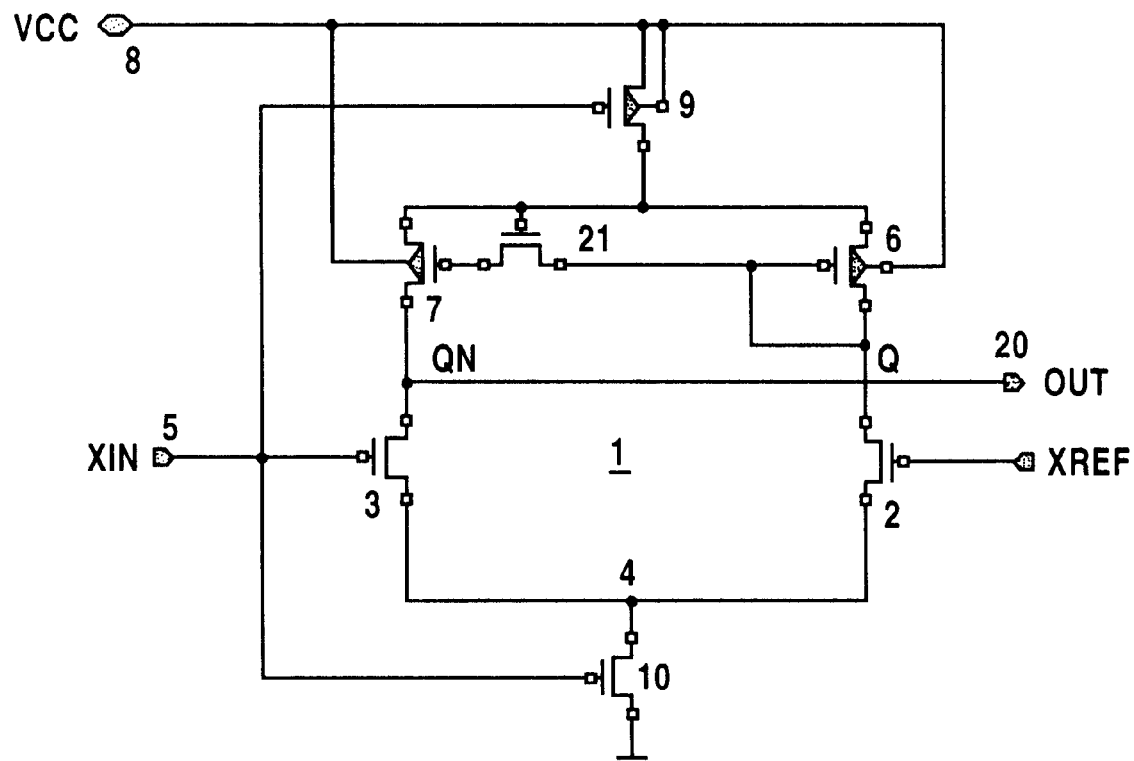
FIG. 2 is a detailed circuit diagram of the input amplifier of FIG. 1.

In order to assure satisfactory operation even with such input signals with steep edges, the input amplifier of the invention additionally has a device X (see FIG. 1), which prevents a complete shutoff of the differential amplifier 1 or of the transistor 7 and for instance (see FIG. 2) comprises an N-channel MOS transistor 21, which is located with its source-to-drain path between the gates of the transistors 6, 7, or between the node Q and the gate of the transistor 7 and is connected with its gate between the source-to-drain paths of the transistors 6, 7 and of the transistor 9, or is acted upon by the operating voltage.

The transistor 21 has the following effect: upon an input signal with a steep high-low edge, the node Q takes on the VCC cutoff voltage of the transistor 6, so that the transistor 6 is shut off. However, since the cutoff voltage of the transistor 21 is higher than the cutoff voltage of the transistor 6, which can be achieved by means of the "bulk effect", a shutoff of the transistor 7 is thereby prevented, and as a result the node QN is pulled upward.

In this way, the input amplifier of the invention makes it possible to switch signals that have very steep edges, so that a shutoff can be performed reliably. The expense for circuitry required in addition to the existing input amplifier is extremely slight, since only the further transistor 21 is additionally needed.

I claim:

1. An input amplifier with unilateral current shutoff for input signals with steep edges, comprising:

an input receiving an input signal and an output outputting an output signal;

a first transistor having an electrode connected to said output;

a second transistor connected to said input and said output;

a third transistor connected to said second transistor, said second and said third transistors configured as a differential amplifier; and a device for preventing a complete shutoff of said first transistor by raising a voltage at said electrode toward an operating voltage of the input amplifier when the input signal with a steep edge is present at said input, said device including a fourth transistor connected to said first transistor and having a higher cutoff voltage than said first transistor.

2. The input amplifier according to claim 1, wherein said first transistor is a MOS transistor of a first conductivity type, and wherein said fourth transistor is a MOS transistor of a second conductivity type.

3. The input amplifier according to claim 2, wherein said differential amplifier further includes said first transistor and a fifth transistor being a MOS transistor each having a gate, a source, and a drain, and wherein said fourth transistor has a source-to-drain path connected between said gates of said first and fifth transistors of said differential amplifier, and wherein the gate of said fourth transistor is connected to one of said source and drain of said first and fifth transistors, and including a sixth transistor having a source drain path connected between the operating voltage and said gate of said fourth transistor and having a gate connected to said input and including a seventh transistor having a source drain path connected between a further operating voltage and said differential amplifier and having a gate connected to said input.

4. The input amplifier according to claim 2, wherein said differential amplifier further includes said first transistor and a fifth transistor being a MOS transistor each having a gate, said fourth transistor having a source-to-drain path connected between said gate of said first transistor and said gate of said fifth transistor, the gate of said fourth transistor being acted upon by the operating voltage, and including a sixth transistor having a source drain path connected between the operating voltage and said gate of said fourth transistor and having a gate connected to said input and including a seventh transistor having a source drain path connected between a further operating voltage and said differential amplifier and having a gate connected to said input.

* * * * *